United States Patent [19]

Yamamura

[11] Patent Number: 4,713,634

[45] Date of Patent: Dec. 15, 1987

[54] SEMICONDUCTOR DEVICE MOUNTED IN A HOUSING HAVING AN INCREASED CUTOFF FREQUENCY

[75] Inventor: Shigeyuki Yamamura, Sagamihara, Japan

[73] Assignee: Fujitsu Limited, Kanagawa, Japan

[21] Appl. No.: 708,609

[22] Filed: Mar. 5, 1985

[30] Foreign Application Priority Data

Mar. 6, 1984 [JP] Japan ............................ 59-042605

[51] Int. Cl.$^4$ ............................................ H05K 5/04
[52] U.S. Cl. .................................. 333/245; 333/247;
357/74; 361/399; 174/52 R
[58] Field of Search ............... 333/247, 246, 251, 245;
357/74; 174/52 S, 52 R; 361/399, 395, 394

[56] References Cited

U.S. PATENT DOCUMENTS

| 2,673,962 | 3/1954 | Kock | 333/251 X |
| 3,936,778 | 2/1976 | De Ronde | 333/246 |
| 4,270,106 | 5/1981 | Woermbke | 333/246 |
| 4,427,991 | 1/1984 | Yamamura et al. | 333/247 X |
| 4,480,290 | 10/1984 | Gould | 333/246 |

FOREIGN PATENT DOCUMENTS

| 110997 | 6/1984 | European Pat. Off. |  |
| 0010948 | 1/1978 | Japan | 333/246 |
| 0068890 | 6/1978 | Japan | 333/161 |
| 58-03922 | 11/1983 | Japan | 357/74 |

OTHER PUBLICATIONS

Moochalla, Shaktur S.; "Semicircular Dome Housing of a RF amplifier", *RCA Technical Note No. 1344*, Apr. 9 1984.

Patent Abstracts of Japan, vol. 5, No. 95(E-62) [767], Jun. 20th 1981; & JP-A-56 40263 (Nippon Denki K.K.), 16-01-1981.

IEEE Transactions on Microwave Theory and Techniques, vol. MTT-29, No. 4, Apr. 1981, pp. 314-322, New York, US; J. Van Bladel: "Dielectric Resonator in a Waveguide Below Cutoff".

*Primary Examiner*—Paul Gensler
*Assistant Examiner*—Benny Lee
*Attorney, Agent, or Firm*—Armstrong, Nikaido, Marmelstein & Kubovcik

[57] ABSTRACT

A semiconductor device including a metallic container for containing a radio frequency semiconductor circuit on a bottom surface thereof; a cap for covering the container; and input and output terminals connected to the circuit and penetrating through a side wall of the container at locations opposite to each other. The bottom surface of the container includes space for mounting the radio frequency semiconductor circuit and supplementary space for mounting elements of a supplementary circuit. A cutoff member for increasing the cutoff frequency of the waveguide mode wave propagation between the input and output terminals within the container is provided on a part of the supplementary space, so that the cutoff frequency is higher than the wave frequency used in the radio frequency semiconductor circuit.

3 Claims, 11 Drawing Figures

SEMICONDUCTOR DEVICE MOUNTED IN A HOUSING HAVING AN INCREASED CUTOFF FREQUENCY

BACKGROUND OF THE INVENTION

1. Field of the Invention

The present invention relates to a semiconductor device, more particularly to an improvement in a container for housing a high-frequency semiconductor circuit using a radio-frequency wave such as a microwave or a millimeter wave.

2. Description of the Related Art

A conventional semiconductor device with a microwave circuit housed within a ceramic container suffers from degradation of circuit characteristics due to the frequency resonance of the container and from damage of the container due to the difference of the thermal expansion coefficient of the ceramic and the metal base plate.

To solve the problems of the conventional semiconductor device, an improved semiconductor device is disclosed in U.S. Pat. No. 571,542, wherein the container is substantially made of metal, with just the lead penetration portions for connection with the inner circuit made of ceramic.

However, with this structure, radio waves propagate from the input side to the output side within the container space, which causes undesired characteristics, e.g. noise on the output signal. This is because the impedance of a part of the circuit matches the impedance of the space within the container, which impedance is usually very high. This causes radiation of the microwave from the input side within the container, resulting in so-called rectangular waveguide mode signal propagation within the container. Therefore, the undesirable wave propagation occurs at a frequency which is used in the circuit of the container.

In order to avoid this, the cutoff frequency of the waveguide within the container must be higher than the frequency of the signal used in the circuit, since the waveguide functions as a high-pass filter. That is, the length of the longer side of the cross-section of the container inner space must be shortened according to the frequency of the signal.

The container requires supplementary space for handling parts of the microwave circuit in addition to and adjacent to the space for mounting the microwave circuit on the container bottom surface. Also, supplementary space is necessary for mounting parts of, for instance, a DC bias circuit of the microcircuit. If the inner length of the container is shortened with the intention of eliminating the above problem, the supplementary space of the container becomes insufficient.

SUMMARY OF THE INVENTION

An object of the present invention is to provide a radio frequency semiconductor device in which the above-mentioned problems are solved, so that it can be used at a desired high frequency without degrading the high frequency characteristics and so that sufficient supplementary space is maintained around the semiconductor circuit for mounting electric components of a supplementary circuit such as a bias circuit or DC power supply circuit and handling the parts when mounting the semiconductor circuit, such as a microwave circuit.

In accordance with the present invention, there is provided a semiconductor device including a metallic container for containing a radio frequency semiconductor circuit on a bottom surface thereof; a cap for covering the container; and input and output terminals connected to the circuit and penetrating through a side wall of the container at locations opposite to each other. The bottom surface includes space for mounting the radio frequency semiconductor circuit and supplementary space for mounting elements of a supplementary circuit. Means for increasing the cutoff frequency of the waveguide mode wave propagation between the input and output terminals within the container is provided on a part of the supplementary space, so that the cutoff frequency is higher than the wave frequency used in the radio frequency semiconductor circuit.

DESCRIPTION OF THE PREFERRED EMBODIMENTS

Figure 1:
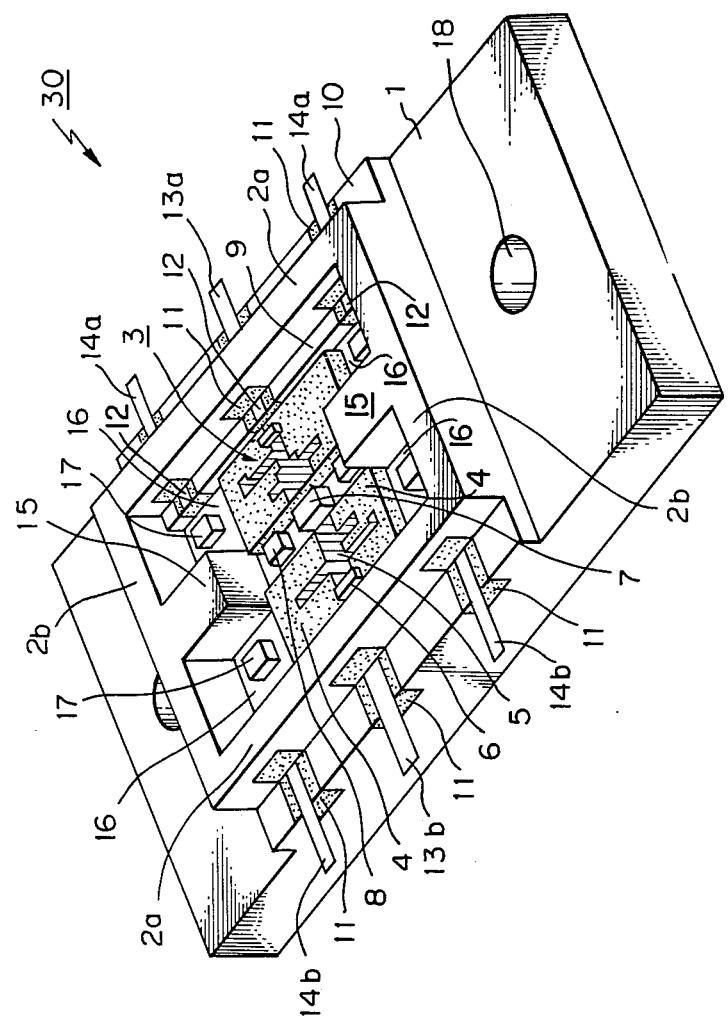
FIG. 1 is a perspective view of an embodiment of the present invention.
Figure 2A:
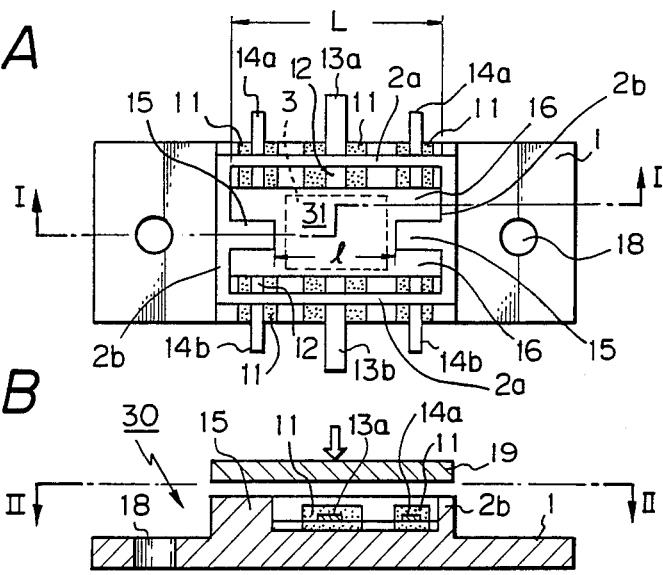
FIG. 2(A) is an upper view of the embodiment of FIG. 1 and seen from II—II of FIG. 2(B)
Figure 2B:
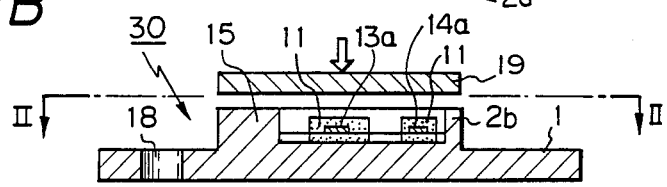
FIG. 2(B) is a sectional view along I—I of FIG. 2(A)

A first embodiment of the present invention is illustrated in FIGS. 1 and 2. A metallic container 30 for containing a microwave circuit 3 therein includes a metallic base plate 1 and side walls 2a and 2b forming an essentially rectangular shape on the base plate 1 and accommodating the microwave circuit 3 therein. A cap 19 (FIG. 2(B)) is disposed on the side walls 2a, 2b for covering the container 30. The container 30 is made of a metal such as copper. The cap 19 is made of metal or ceramic having a metallized surface. A hole 18 for attaching the container 30 to another location is provided on the base plate 1.

The microwave circuit 3 is a strip line type circuit and includes, for example, a pair of ceramic plates 4, on which a matching circuit pattern 5 is printed and a DC blocking capacitor 6 is mounted, and a field effect transistor (FET) 7 and capacitors 8 disposed between the ceramic plates 4, to constitute a single end type amplifier. The parts are connected to each other by wires (not shown).

Capacitors 17, which constitute a supplementary bias circuit for DC power supply or ground connection, are mounted beside the microwave circuit 3 and connected thereto by wires (not shown). Therefore, the bottom surface inside of the side walls 2a, 2b of the container 30 requires not only space 31 (FIG. 2) for mounting the microwave circuit 3 but also supplementary space 16 for mounting electric components for a supplementary circuit such as a bias circuit. Such a supplementary space 16 is also required as space for handling elements of the microwave circuit 3 when mounting it on the bottom surface of the container 30.

Three terminals 12 are disposed on one side of the side wall 2a and three other terminals are disposed on the opposite side of the side wall 2a. Each terminal 12 penetrates through the side wall 2a so as to interconnect the inner circuits and outer lines (not shown). Each terminal 12 is surrounded by ceramic 11 to be isolated from the side wall 2a. The size of the ceramic 11 is determined considering the impedance matching characteristic thereof corresponding to the impedance of the inner circuit. Steps 9, 10 having a thickness corresponding to the thickness of the ceramic plate 4 are formed on the inner and outer sides of the side wall 2a. Each terminal 12 is exposed on the ceramic 11 on the steps 9 and 10.

Figure 4A:
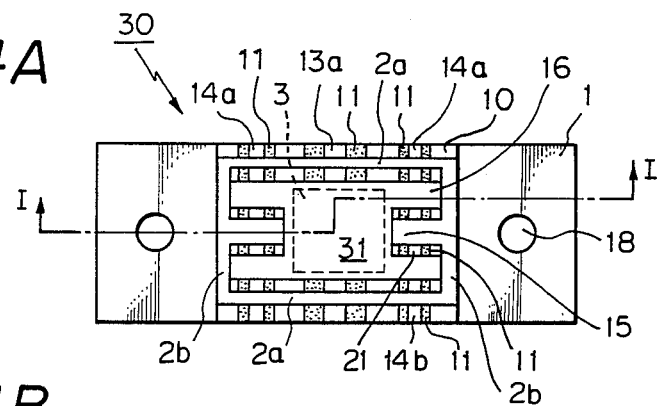
FIG. 4(A) is an upper view of still another embodiment of the present invention, seen from II—II of FIG. 4(B)

Leads 13a, 13b, 14a, 14b, each of which is integral with or connected to a terminal 12, project out of the side wall 2a. Leads 13a and 13b designate a radio frequency wave input lead and output lead, respectively. Leads 14a and 14b designate DC input and output leads, respectively. Metallized film may be formed on the ceramic 11 from the inner step 9 to the outer step 10 penetrating the side wall 2a to constitute a terminal 12. With such a structure, the outer projecting leads 13a, 13b, 14a, 14b may be deleted, as illustrated in FIG. 4(A). If a radio frequency wave circuit using a self-bias FET or a diode is housed in the container, the number of the DC terminals may be one on each side.

A projection 15 is formed inward of and integral with each side wall 2b on each side perpendicular to the side wall 2a having the terminals 12. The projection 15 extends in height between the lower surface of the cap 19 and the bottom surface of the container. The projection 15 functions as a filter of the radio wave propagating within the container in a waveguide mode.

The metal container 30 functions as a rectangular waveguide with the cap 19. The cutoff wavelength of the waveguide mode wave propagating within the container from the input terminal lead 13a to the output terminal lead 13b mainly depends on the length of the longer side of the waveguide section, i.e., the length of the cross-section parallel to the side wall 2a having terminals. That length is defined by the length (l) between the projections 15 and becomes shorter than the length (L) (see FIG. 2a), which is the length to determine the cutoff wavelength in the case where the projections 15 are not provided. Therefore, the cutoff wavelength is shortened, which means the cutoff frequency is increased. The relationship between the cutoff wavelength $\lambda$ and the length of the longer side of the waveguide section l (or L) is $\lambda = 2\,l$ (or $2\,L$).

The waveguide functions as a high-pass filter. Therefore, by arranging the length (l) so that the cutoff frequency is higher than the wave frequency used in the microwave circuit, waveguide mode propagation of the wave having the frequency of the microwave circuit does not occur. Accordingly, no wave propagation occurs so that all of the input high frequency signal is introduced into the microwave circuit 3 from the input terminal lead 13a and transmitted to the output terminal lead 13b. Therefore, noise due to the wave propagation of the waveguide mode and transmission loss are minimized and the circuit characteristics are stabilized. Also, it is possible to use a very high frequency wave by providing an appropriate size projection 15.

With the above arrangement in accordance with the present invention, though the inner length of the container as a waveguide is shortened, supplementary space 16 still remains on both sides of the projection 5, so that the microwave circuit can be conveniently handled at the time of forming it on the bottom surface of the container.

Figure 3A:
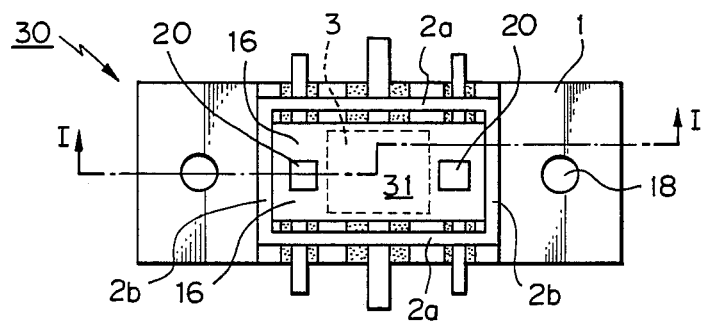
FIG. 3(A) is an upper view of another embodiment of the present invention, seen from II—II of FIG. 3(B)
Figure 3B:
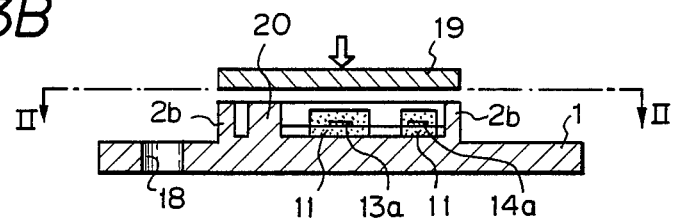
FIG. 3(B) is a sectional view along I—I of FIG. 3(A)

A second embodiment of the present invention is illustrated in FIG. 3. In this embodiment, metallic projections 20 which are separated from the side wall 2b are provided as cutoff means for filtering the waveguide mode propagation of the radio wave, instead of the projection 15 of the first embodiment. The other constructions, functions, and effects of the structure are substantially the same as those of the first embodiment. With this structure, the space between the projections 20 and the side wall 2b is also utilized as supplementary space.

Figure 4B:
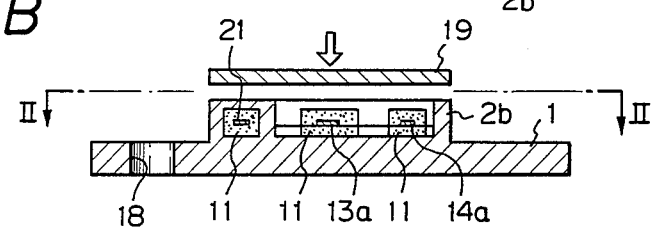
FIG. 4(B) is a sectional view along I—I of FIG. 4(A)

A third embodiment is illustrated in FIG. 4. In this embodiment, the projection 15 arranged similarly to the structure of the first embodiment has a terminal 21 surrounded by ceramic 11 and penetrating through the projection. Also, the outer leads 13a, 13b, 14a, 14b do not project out of the container edge. The other constructions, functions, and effects are substantially the same as those of the first embodiment. With the structure of the third embodiment, the electric components disposed in the supplementary space 16 on the opposite sides of the projection 15 can be easily connected to each other by using the terminal 21 penetrating through the projection 15. Also, it is convenient to dispose a plurality of the containers side by side closely in parallel, since the leads are not projected out of the side wall of the container.

Figures 5A, 5B, 5C:
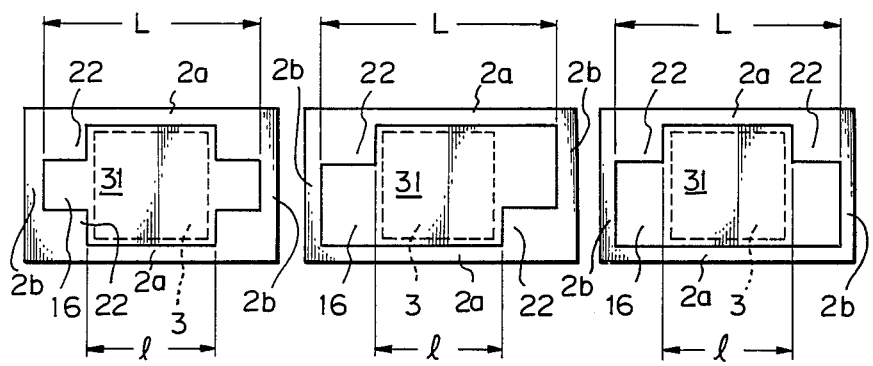
FIGS. 5(A)-5(C) show further examples of a container of the present invention.

Further different formations of the container in accordance with the present invention are illustrated in FIGS. 5(A), 5(B), and 5(C). In these examples, cutoff members 22 are formed on both sides of the space 31 for mounting a radio frequency semiconductor circuit such as a microwave circuit 3, leaving the supplementary space 16 as in the above-mentioned embodiments. The cutoff members 22 shorten the length of the long side of the container, which length determines the cutoff frequency of the waveguide mode wave propagation from (L) to (l).

Figure 6:
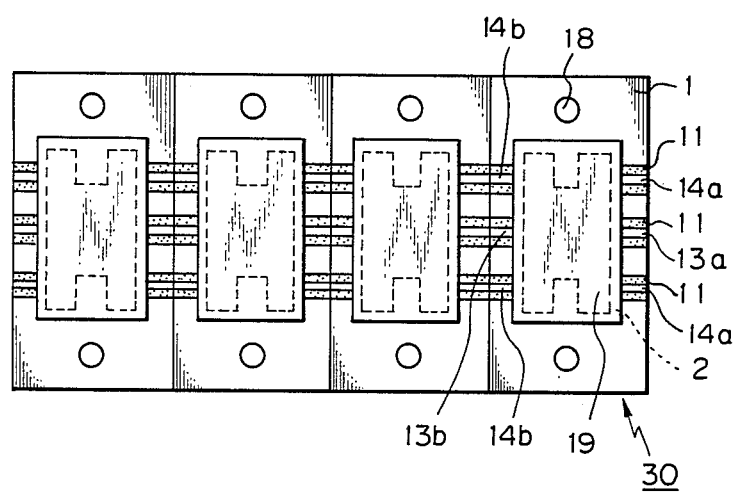
FIG. 6 shows an example of a combined state of a plurality of semiconductor devices of the present invention.

FIG. 6 is an upper view of the arrangement of four semiconductor devices of the present invention disposed close together side by side and connected to each other through the terminals 13a, 13b, 14a, 14b of each container 30. With such an arrangement, a plurality of semiconductor devices having stable characteristics and using a desired high frequency can be compactly interconnected.

I claim:

1. A semiconductor device comprising:
   a metallic container comprising a bottom surface, a first pair of opposite side walls and a second pair of opposite side walls, said first pair of side walls being perpendicular to said second pair of side walls thereby forming a rectangular frame on said bottom surface, said container enclosing a radio frequency semiconductor circuit having a semiconductor element on said bottom surface;
   input and output terminals connected to said circuit and penetrating through said first pair of opposite side walls of said container;
   wherein said bottom surface includes a main space for mounting said radio frequency semiconductor circuit in the middle portion of the rectangular frame with respect to the direction parallel to the first pair of side walls and a supplementary space for mounting elements of a supplementary circuit in the end portions of the rectangular frame positioned to the side of said middle portion thereof;

a cap covering said container; and metallic projection means formed inwardly and integral with said second pair of side walls, said projection means extending between said cap and said bottom surface and being disposed within said supplementary space to narrow the cross-section of the container in a direction parallel to said first pair of side walls thereby reducing the effective length of said container to reduce the cutoff wavelength thereof and thus increase the cutoff frequency thereof, wherein at least a portion of said supplementary space is formed to the side of each projection means.

2. A semiconductor device according to claim 1, wherein a metallic film, for an electrical terminal surrounded by an insulating member, penetrates through said projection means.

3. A semiconductor device comprising:

a plurality of metallic containers, each metallic container comprising a bottom surface, a first pair of opposite side walls and a second pair of opposite side walls, said first pair of side walls being perpendicular to said second pair of side walls thereby forming a rectangular frame on said bottom surface, said container enclosing a radio frequency semiconductor circuit having a semiconductor element on said bottom surface;

input and output terminals connected to said circuit and penetrating through said first pair of opposite side walls of each said container;

wherein said bottom surface includes a main space for mounting said radio frequency semiconductor circuit in the middle portion of the rectangular frame with respect to the direction parallel to the first pair of side walls and a supplementary space for mounting elements of a supplementary circuit in the end portions of the rectangular frame positioned to the side of said middle portion thereof;

a cap covering said each container; and metallic projection means formed inwardly and integral with said second pair of side walls, said projection means extending between said cap and said bottom surface and being disposed within said supplementary space to narrow the cross-section of each container in a direction parallel to said first pair of side walls thereby reducing the effective length of said container to reduce the cutoff wavelength thereof and thus increase the cutoff frequency thereof, wherein at least a portion of said supplementary space is formed to the side of each projection means;

wherein said metallic containers are disposed side by side with said side walls having said input and output terminals of adjacent containers facing each other.

* * * * *